United States Patent
Groβ

(10) Patent No.: US 9,886,800 B2
(45) Date of Patent: *Feb. 6, 2018

(54) ENGINE STATE DETECTION DEVICE

(71) Applicant: TomTom Telematics B.V., Amsterdam (NL)

(72) Inventor: Tobias Groβ, Leipzig (DE)

(73) Assignee: TOMTOM TELEMATICS B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/826,382

(22) Filed: Aug. 14, 2015

(65) Prior Publication Data

US 2016/0049018 A1 Feb. 18, 2016

(30) Foreign Application Priority Data

Aug. 15, 2014 (GB) .................... 1414566.8

(51) Int. Cl.
G07C 5/00 (2006.01)
G07C 5/02 (2006.01)
G07C 5/08 (2006.01)
G01R 31/00 (2006.01)

(52) U.S. Cl.
CPC ............ G07C 5/02 (2013.01); G01R 31/007 (2013.01); G07C 5/085 (2013.01); G07C 5/008 (2013.01)

(58) Field of Classification Search
None
See application file for complete search history.

(56) References Cited

U.S. PATENT DOCUMENTS

| 8,682,525 | B1 | 3/2014 | Kalinadhabhotla et al. |
| 2004/0083041 | A1 | 4/2004 | Skeen et al. |
| 2011/0106373 | A1 | 5/2011 | Hergesheimer et al. |
| 2013/0013348 | A1 | 1/2013 | Ling et al. |
| 2014/0074353 | A1* | 3/2014 | Lee .................. B60R 25/33 701/36 |
| 2015/0217752 | A1* | 8/2015 | Rueger .............. B60W 10/06 701/22 |

FOREIGN PATENT DOCUMENTS

WO 2004040405 A2 5/2004

OTHER PUBLICATIONS

United Kingdom Search Report for GB1414566.8 dated Feb. 16, 2015.
The International Search Report dated Nov. 23, 2015 for International Application No. PCT/EP2015/068803.

* cited by examiner

Primary Examiner — James M McPherson

(57) ABSTRACT

A device for collecting vehicle on-board diagnostics (OBO) data is disclosed, together with an associated method of collecting OBD data in such devices. In embodiments, the OBO data collection device includes a connector for connecting the device to a vehicle OBO port to receive OBO data and power and a processor for controlling collection of the OBO data. The processor is arranged to determine a vehicle engine state by monitoring a voltage at the connector, taken in combination with OBD data relating to vehicle speed and/or engine revolutions. Such devices are able to reliably detect both engine 'on' and 'off' states in modern vehicles that use "smart charging" technology.

18 Claims, 6 Drawing Sheets

ENGINE STATE DETECTION DEVICE

CROSS-REFERENCES TO RELATED APPLICATIONS

The application claims priority to United Kingdom Patent Application No. 1414566.8, filed Aug. 15, 2014; the entire contents of which is incorporated herein by reference.

FIELD OF THE INVENTION

The present invention relates to devices and methods for detecting the state of a vehicle's engine using data collected via the OBD port of the vehicle. In embodiments, the invention relates to wireless communication devices for collecting vehicle on-board diagnostics (OBD) data and associated methods for controlling such wireless communication devices.

BACKGROUND OF THE INVENTION

A motor vehicle's on-board diagnostics (OBD) system provides self-diagnostic and reporting capability that can enable a vehicle owner or mechanic to access information about the engine and other vehicle sub-systems. All new motor vehicles are now equipped with a standard OBD-II or EOBD connector in line with regulations in force since 1996 in the USA, since 2000 for new passenger cars and LCVs in the EU, and since 2004 for HGVs in the EU. The OBD connection port in a vehicle can provide real-time engine data in addition to standardised diagnostic trouble codes which allow a mechanic to rapidly identify and remedy problems with the vehicle.

More recently, there have become available OBD data collection devices comprising a connector so as to be plugged into a vehicle's OBD port on a long-term basis to receive OBD data for a variety of purposes. For example, the TomTom ecoPLUS™ device can be installed in a vehicle belonging to a fleet so as to provide accurate information on fuel consumption and efficiency which is transmitted to an external server and displayed, for example, to a fleet manager. In another example, TomTom's LINK 100 is an OBD-II Bluetooth dongle that sends data from the vehicle's OBD port to the driver's smartphone so as to provide insurers, car manufacturers, road side assistance or leasing companies with access to usage and driving performance data. An insurance company may, for example, provide an OBD data collection device that plugs into a vehicle's OBD port so as to automatically track driving habits and thereby determine the insurance premium payable. This is known as usage-based insurance (UBI).

An example of a UBI data logging device is described in US 2013/0013348 A1. Such a data logging device includes a microprocessor and wireless GSM transceiver so that vehicle usage information can be transmitted to an insurer or other external entity. WO 2004/040405 A2 provides another example of an OBD data logging module that is configured to plug into the OBD-II port of a vehicle and record data, using engine start to define the beginning of a trip and engine stop to define the end of a trip. The module monitors driver habits and has a wireless communication interface so that OBD data can be transmitted to an external computer for interrogation. Such an OBD module can connect to the 12 V supply of the vehicle battery.

Typically, an OBD device will determine when the vehicle's engine is started or stopped by monitoring the engine revolutions or sensing vehicle voltage. However, it is not always straightforward for the OBD device to interrogate the engine status because several vehicles can provide a misleading response when the engine is turned off and the engine control unit (ECU) is in a low power state. It has therefore been proposed that the OBD device senses the voltage level provided on the OBD connector. The OBD device may be woken from a sleep mode by determining a change of engine state through sensing the voltage level. For example, a voltage above a threshold of 13.2 V may be taken as a clear indicator that the alternator is running to charge the vehicle battery and hence the engine must be running. Sensing a voltage below this threshold suggests the engine has been stopped.

However a rising number of vehicles are now equipped with "smart charging" technology, a form of regulated voltage control, that uses system information to optimise the voltage supplied to the battery. A "smart charging" alternator, controlled by the ECU, may allow the charging voltage to drop below the normal charging range e.g. of 13.8-14.8 V. As the charging voltage may fluctuate while the engine is running, it becomes unpredictable for an OBD device to reliably detect engine state solely based on voltage levels.

Accordingly, there remains a need for an improved OBD data collection device.

SUMMARY OF THE INVENTION

According to a first aspect of the invention there is provided a device for collecting vehicle on-board diagnostics (OBD) data, the device comprising: a connector for connecting the device to a vehicle OBD port to receive OBD data and power; and a processor for controlling collection of the OBD data, wherein the processor is arranged to determine a vehicle engine state by monitoring a voltage at the connector, the processor: (i) detecting an engine 'on' state from a temporary voltage drop of at least a predetermined magnitude; and (ii) detecting an engine 'off' state from a voltage value that is less than a threshold, taken in combination with OBD data relating to vehicle speed and/or engine revolutions.

Such an OBD data collection device is able to reliably detect both engine 'on' and 'off' states in modern vehicles that use "smart charging" technology and ECUs that may report constant non-zero values for speed and/or engine revolutions (rpm) even after the engine has been stopped. Previous proposals to monitor either voltage levels or speed/rpm alone so as to detect the engine state, especially the engine 'off' state, may not have accurately sensed both engine 'on' and engine 'off' events, resulting in errors in the collection of OBD data. It can be particularly important to detect the engine 'off' state, because if the OBD device were to continue taking power from the vehicle OBD port after the engine has been stopped then this could run down the vehicle battery.

In order to reliably detect a true engine 'off' state, the processor in the OBD data collection device may undergo a two-stage detection process. Firstly, a pending engine 'off' state may be flagged as a result of detecting a voltage value, optionally an average voltage value, that is less than a threshold. For example, the voltage at the connector falling below a threshold of 13.2 volts (V) may be taken as a first (but not definitive) indication that the engine has been stopped. Thus in a set of embodiments the processor detects a pending engine 'off' state from a voltage value, or average voltage value, that is less than a threshold for a predetermined time period, e.g. of at least 1 second (s) or 2 s, and preferably at least 3 s. The threshold may be at least 13 V, preferably around 13.2 V. Secondly, this is taken in combination with OBD data relating to vehicle speed and/or engine revolutions.

In a set of embodiments the processor confirms the pending engine 'off' state from OBD data relating to vehicle speed and/or engine revolutions being constant for another predetermined time period, e.g. of at least 1 s, 2 s, 3 s, or 4 s. Preferably the processor confirms a pending engine 'off' state from OBD data relating to vehicle speed and/or engine revolutions being constant for a predetermined time period of at least 5 seconds. The constant value may be zero or non-zero, as some vehicles can report non-zero values for speed and engine revolutions even after the engine has stopped running.

Alternatively (or in addition), in another set of embodiments the processor confirms the pending engine 'off' state from OBD data relating to vehicle speed and/or engine revolutions no longer being received at the vehicle OBD port. This is indicative of the vehicle's ECU no longer providing such OBD data to the vehicle OBD port. The processor may detect the absence of such OBD data from an invalid input.

Following this two-stage process, the processor may then detect a transition from the pending engine 'off' state to a final engine 'off' state after a further predetermined time period, e.g. of at least 10 seconds, has elapsed. This ensures that a false detection of the engine 'off' state is avoided.

Preferably the processor is arranged to stop collection of the OBD data when the final engine 'off' state is detected. Thus, only once the processor has run the two-stage detection process above is it determined that the engine is truly 'off' and OBD data collection may be halted. This can prevent erroneous OBD data collection in vehicles equipped with "smart charging" technology. When it is finally determined that the engine is not running then, after a certain time period, the device may enter a sleeping mode in which no power is taken from the vehicle OBD port. The device therefore saves power in between trips.

In order to reliably detect a true engine 'on' state, the processor in the OBD data collection device detects a temporary voltage drop rather than simply comparing the voltage level at the connector to an absolute threshold, e.g. 13.2 V. In a set of embodiments the processor detects an engine 'on' state from a temporary voltage drop of a predetermined magnitude, e.g. at least 2 volts, that lasts for a time period of less than 1 second. Preferably the processor detects an engine 'on' state from a temporary voltage drop of a predetermined magnitude, e.g. at least 2 volts, that lasts for a time period of at least 400 ms and less than 1 s. Further preferably the processor detects an engine 'on' state from a temporary voltage drop of at least 3 volts. Since the temporary voltage drop may appear only as a brief "spike" in the detected voltage level, the processor must be able to distinguish this from other, typically smaller, changes in the voltage level, e.g. resulting from "smart charging". In a set of embodiments the processor detects an engine 'on' state by sampling the voltage at the connector at a frequency of at least 4 Hz, 5 Hz, 6 Hz, 7 Hz, or 8 Hz.

As is mentioned above, in relation to detection of a final engine 'off' state, the processor may be arranged to control collection of the OBD data based on the determined engine state. In a set of embodiments the processor is arranged to start collection of the OBD data when an engine 'on' state is detected. The determined engine state can be used to set the start and end of a trip, and hence trip duration. Detection of an engine 'on' state may also act to awaken the OBD data collection device from a sleeping mode and cause a transition to a running mode. Alternatively, or in addition, the device may be woken from its sleeping mode by receiving a pairing request from an external mobile telecommunications device.

In embodiments, the OBD data collection device is a wireless communication device, and further comprises a wireless transceiver for pairing with an external mobile telecommunications device to wirelessly transmit the collected OBD data. Accordingly, in such embodiments, the device is arranged to use an external mobile telecommunications device as a local gateway for the transmission of OBD data to a remote server, rather than having its own Internet connection. In fact the wireless communication device preferably does not include an Internet connection, e.g. a mobile telecommunications device, such as a GSM or GPRS device, for communicating with a remote server. This means that a user can control the transmission of OBD data from the device by deciding when to pair a mobile telecommunications device that does provide such an, e.g. Internet, connection. User privacy is thereby enhanced.

Optionally the processor includes a real-time clock powered by the connector and arranged to apply time stamps to the OBD data e.g. as collected. Further optionally the wireless communication device determines when it has been disconnected from the vehicle OBD port and corrects the time-stamped OBD data by synchronising with an external reference clock signal provided by the mobile telecommunications device before the corrected OBD data is transmitted to the external mobile telecommunications device. After synchronising with the external reference clock signal, the method may further comprise the step of transmitting the corrected OBD data from the wireless communication device to the external mobile telecommunications device. Optionally, the method may further comprise resetting the real-time clock after the corrected OBD data has been transmitted from the wireless communication device.

In certain embodiments, the device may determine when it has been disconnected from a vehicle OBD port by determining that power has been disconnected from the connector. Optionally, the disconnection event may be given a time stamp by the real-time clock. The disconnection event may then be logged with a time stamp in the device's memory. One or more disconnection events may take place before the wireless communication device is next paired with an external mobile telecommunications device. The time stamps of the disconnection events can be used to calculate the time that elapsed before the device was re-connected and therefore the applicable time correction factor. It will be appreciated that time-stamped data collected between different disconnection events may therefore be corrected using a different time correction factor once the device synchronises with an external reference clock signal.

When a mobile telecommunications device is paired with the OBD data collection device, the device may carry out the clock synchronisation process described above, e.g. whenever it determines that the time-stamped OBD data is out of sync because it has been disconnected (one or more times) from the vehicle's OBD port since the last time it was paired. Either the wireless communication device or the mobile telecommunications device may initiate clock synchronisation. Once the time-stamped data has been corrected by synchronising with the external reference clock signal, the mobile telecommunications device preferably communicates a data transmission instruction to the wireless communication device.

Optionally the real-time clock may be provided with a back-up power supply internal to the device, e.g. a battery, so that the clock keeps running even if the device is disconnected from the vehicle OBD port. However, to keep the OBD data collection device compact, it is preferable that the device that does not have an internal power supply.

Optionally the OBD data collection device comprises a memory for storing the collected OBD data e.g. for local storage of the collected OBD data when no wireless connection to an external mobile telecommunications device is available for real-time transmission. The method may optionally further comprise deleting the collected OBD data from the device's memory after the OBD data has been transmitted from the wireless communication device.

It is a preferred feature of various embodiments of the present invention that the OBD data collection device does not include its own connection to a telecommunications network, e.g. GSM, GPRS or the like. Unlike conventional UBI data collection devices, user privacy may be respected by avoiding real-time tracking of driver habits. Instead it may be under a users control to pair a mobile telecommunications device with the wireless communication device that is collecting OBD data. If the OBD data collection device is not continuously paired with an external mobile telecommunications device, the collected OBD data may be stored in the device's memory until a later time when a data transmission instruction is received. The wireless transceiver may be arranged to communicate a batch of stored OBD data when the OBD data collection device is paired with a mobile telecommunications device. The wireless transceiver is preferably a short-range transceiver using infrared or radio frequency communication, e.g. Bluetooth protocol. Of course the mobile telecommunications device preferably includes a corresponding wireless transceiver configured with the same protocol.

In one set of embodiments the mobile telecommunications device may automatically instruct transmission of the collected OBD data whenever it pairs with the wireless communication device. In another set of embodiments, the mobile telecommunications device may communicate a data transmission instruction to the OBD data collection device when commanded to do so by a user. This provides a user with flexibility in deciding when data is transmitted from the OBD data collection device. However it is desirable that OBD data is not stored indefinitely in the memory of the OBD data collection device, especially so that the size of the memory can be limited. The mobile telecommunications device may therefore prompt a user to instruct transmission of OBD data from the OBD data collection device when it determines that no OBD data has been received for a certain period of time, e.g. over 20 days.

The OBD data received by the mobile telecommunications device may optionally be displayed to a user. While the devices are paired, the user may be provided with real-time driving feedback, e.g. via an app running on the mobile telecommunications device. In some embodiments the OBD data may not be shared with a third party. However, in a preferred set of embodiments the mobile telecommunications device acts as a gateway for uploading the collected OBD data to an external server. The mobile telecommunications device may therefore provide the dual functions of providing user feedback and an internet connection to share the OBD data with backend support. While the OBD data collection device logs data without needing its own internal power supply, the mobile telecommunications device can conveniently provide an external reference clock signal to ensure integrity of the OBD data before it is uploaded to the network. The external server can ensure secure long-term storage of the uploaded OBD data.

The present invention therefore extends to a collection system for vehicle on-board diagnostics (OBD) data, the system comprising: (a) a wireless communication device for collecting OBD data as described hereinabove; and (b) a mobile telecommunications device for pairing with the wireless communication device and uploading OBD data to an external server. The system may further comprise (c) the external server that receives OBD data uploads from the mobile telecommunications device. The external server may provide reports to the user and/or a third party such as an insurance company.

As is mentioned above, preferably the mobile telecommunications device provides a user interface for a user to control when the collected OBD data is uploaded. In addition, or alternatively, the mobile telecommunications device preferably provides a display for the collected OBD data. The mobile telecommunications device, such as a smartphone, may therefore give feedback to a user while he or she is driving.

The mobile telecommunications device may display one or more types of OBD data selected from, for example, vehicle speed, engine rpm, fuel system status, calculated engine load, engine coolant temperature, intake manifold pressure, intake air temperature, throttle position, engine torque, and fuel rate. Such OBD data may be displayed in real-time when the mobile telecommunications device is paired with the OBD data collection device. The mobile telecommunications device may use the collected OBD data to calculate and display feedback information in relation to driving events and/or fuel consumption. The mobile telecommunications device may optionally display trip-related data such as trip duration and/or distance.

Preferably the OBD data collection device does not include a global navigation satellite system (GNSS) receiver, e.g. a GPS receiver, or any other location determining device—so that the vehicle's actual movements are not tracked by the device, again to respect user privacy. Without such location, e.g. GPS, data the OBD data collection device can not directly determine a distance travelled. In a preferred set of embodiments the OBD data collection device calculates a distance travelled by the vehicle based on OBD data relating to vehicle speed, e.g. providing a virtual odometer. The mobile telecommunications device may display the calculated distance travelled as a virtual odometer reading. Preferably a user is prompted by the mobile telecommunications device to verify the virtual odometer reading, e.g. through comparison with the mileage displayed on the dashboard odometer. Based on user feedback, the mobile telecommunications device may send an odometer calibration signal to the OBD data collection device. The OBD data collection device may use the calibration signal to calibrate its calculation of the distance travelled by the vehicle based on OBD data such as vehicle speed. This enhances the sensitivity of the virtual odometer.

The OBD data collection device's virtual odometer may furthermore be used to inform risk profile data, that is, indicators of driver and/or vehicle performance that can be extracted from the collected OBD data. In a set of embodiments the OBD data collection device does not simply collect OBD data. The processor may be arranged to aggregate the collected OBD data into risk profile data comprising one or more scalar indicators and/or histogram indicators. Aggregating the raw OBD data into risk profile data advantageously reduces the amount of memory required in the OBD data collection device. This makes it easier for the device to store data for an extended period of time, e.g. up to 10 days, 20 days, 30 days, 40 days or even 50 days, before being transmitted to a mobile telecommunications device. As a result the OBD data collection device can be kept compact in size.

As is mentioned above, aggregating the OBD data into risk profile data can optimise the device's data storage capacity. The memory may have a storage capacity, e.g. of only 4 MB or less, while the OBD data collection device is not reliant on a real-time data link with an external mobile telecommunications device. Furthermore a user decides if and when to transmit the risk profile data rather than driving performance being automatically tracked. In addition, aggregating the OBD data can also reduce the mobile bandwidth requirement when the risk profile data is transmitted to an external mobile telecommunications device.

The risk profile data may be stored in the memory for several days or weeks between data transmission instructions. For example, the memory may be capable of storing risk profile data for up to 20 days, 30 days, 40 days and preferably up to 45 or 50 days. This means that a data transmission instruction only needs to be received by pairing the devices around once a month, which is particularly suited to infrequent drivers.

The OBD data collection device may collect and aggregate a number of different types of OBD data relating to vehicle use and/or driving performance to provide the risk profile data.

Preferably each scalar indicator represents a single average value for a particular category of OBD data in a given time period. For example, the time period may be 24 hours. The scalar indicator(s) therefore provide risk profile data aggregated on a daily basis. When the risk profile data is transmitted from the OBD data collection device, e.g. to be uploaded to an external server, then the scalar indicators can provide a long-term overview of vehicle usage with a daily granularity. For a scalar indicator the particular category of OBD data may be chosen from one or more of: (i) distance travelled i.e. mileage; (ii) driving time; (iii) idling time; (iv) number of trips; (v) trip duration; (vi) trip distance; and (vii) number of cold starts.

Preferably each histogram indicator represents the distribution of a particular category of OBD data in one or more given ranges. For example, the OBD data relating to trip duration may be aggregated and histogrammed in time ranges, e.g. <10 mins, <30 mins, <1 hour, <2 hours, and >2 hours, to provide a histogram indicator of the distribution of trip durations. The risk profile data including such histogram indicators can therefore provide an overview of performance indicators such as braking events, average trip duration, driving time by time of day, and driving time by vehicle speed. For a histogram indicator the particular category of OBD data may be chosen from one or more of: (i) average vehicle speed; (ii) maximum vehicle speed; (iii) acceleration; (iv) deceleration; (v) driving time; (vi) distance travelled, i.e. mileage; (vii) trip duration; (viii) trip distance; (ix) braking force; (x) engine revolutions; (xi) engine load; (xii) engine torque; (xiii) throttle position; (xiv) engine temperature; (xv) intake manifold pressure; (xvi) intake air temperature; and (xvii) fuel rate.

The histogram indicator(s) may be chosen from one or more of: (i) number of trip durations in a given time range; (ii) number of trip distances in a given distance range; (iii) duration of driving time in a given speed range; (iv) duration of driving time in a given period of the day; (v) distance travelled i.e. mileage in a given speed range; (vi) distance travelled, i.e. mileage in a given period of the day; (vii) number of braking events in a given braking force range; (viii) engine running time with revolutions in a given rpm range; (ix) engine running time with load in a given load range; (x) engine running time with temperature in a given temperature range; and (xi) duration of driving time in a given range of throttle position.

The risk profile data may also comprise additional indicators such as acceleration force, cornering force (right) and cornering force (left). The histogram indicator(s) may further include: (i) number of acceleration events in a given force range; and/or (ii) number of cornering events in a given force range. Any suitable acceleration sensor may be used to provide such data. Although the acceleration data may be supplied to the OBD data collection device from an external sensor, preferably the OBD data collection device further comprises an accelerometer for this purpose.

In fact it is a preferable feature of various embodiments of the invention for the OBD data collection device to include an acceleration sensor or accelerometer. The accelerometer may be configured to detect a crash event, e.g. when the measured acceleration/deceleration force exceeds a certain threshold. In all such embodiments the OBD data collection device may further collect data relating to a detected crash event, such as one or more of: acceleration value; acceleration direction; distance travelled at time of crash; and OBD data such as vehicle speed, engine rpm, throttle position, engine load, etc. Where a real-time clock is included, the crash event data can be given a time stamp. If the device does not have an internal power supply, as is preferable, then the time stamp can be corrected if necessary as described above. The device preferably collects crash event data for a time period before the event, e.g. up to 30 or 45 seconds before the event, and/or for a time period after the event, e.g. up to 15 seconds after the event. Where the device includes a local memory, the crash event may be logged in the device's memory until it is paired with a mobile telecommunications device and the data is transmitted.

As is mentioned above, in embodiments of the present invention it is preferable that the OBD data collection device does not include a global navigation satellite system (GNSS) receiver, e.g. a GPS receiver, or any other location determining device, so that the vehicle's location can not be tracked as part of the data collected by the communication device. This enhances user privacy. However, OBD data collection devices that use an accelerometer, e.g. to detect a crash event, typically rely on location data, in particular speed and direction, for calibration. This is because the orientation of the device relative to the vehicle may not be known. The same OBD data collection device might be used in different vehicles that have OBD ports installed at different positions and/or angles. It is known, for example from WO 2011/003462 A1, to use a location determining device such as a GPS device to calibrate a vehicle accelerometer device; the entire content of this application is incorporated herein by reference. However an alternative solution is for the OBD data collection device to comprise an accelerometer, wherein the processor is arranged to determine an orientation of the accelerometer based on the collected OBD data. Preferably such a device does not include a GPS receiver or other location determining means. Accordingly the device is able to calibrate the accelerometer using only OBD data, e.g. self-calibration. Once the processor has determined an orientation of the accelerometer, it can transform acceleration data measured by the accelerometer from the frame of reference of the device to the frame of reference of the vehicle. The device is therefore able to calibrate itself to take into account its orientation in the vehicle.

It follows that the OBD data collection device therefore has no fixed installation requirements in the vehicle. As compared to prior art systems that rely on a GNSS receiver, e.g. GPS receiver, to determine the orientation of an accelerometer, such a device instead takes advantage of the OBD data collected from the vehicle OBD port. The Applicant has recognised that this makes it possible to omit a GPS receiver altogether. Indeed, as is mentioned above, preferably the device does not include a GPS receiver or other location determining means.

By determining an orientation of the accelerometer relative to the vehicle, the processor may further be configured to rotate an acceleration vector measured by the accelerometer to fit the coordinate system of the vehicle. Any suitable OBD data can be used to determine an orientation of the accelerometer, as long as the processor is able to use the OBD data to accurately determine a vector property of motion of the vehicle, such as acceleration and/or velocity. In broadest terms, the processor may be configured to determine that at least one OBD data satisfies at least one predetermined condition in a predetermined time period so as to indicate vehicle direction. Once the processor has ascertained vehicle direction then it can compare the vehicle direction with an acceleration vector measured by the accelerometer to obtain an angle of orientation of the accelerometer with respect to the vehicle.

The at least one predetermined condition may comprise a condition that a vehicle trajectory property determined from the OBD data matches a vehicle trajectory property measured by the accelerometer. If the vehicle includes its own accelerometer then the OBD data may comprise acceleration and/or deceleration data. If, for example, the processor determines that acceleration data measured by the device's accelerometer matches acceleration data received from the OBD port then the device frame of reference may be considered to be oriented in line with the vehicle frame of reference. However, in practice this may rarely occur. In a preferred set of embodiments the processor is configured to determine an orientation of the accelerometer based on velocity data received from the vehicle OBD port. Such self-calibration may use the direction of an OBD speed vector to inform the processor that the vehicle is moving along a straight line at any instant in time.

So as to reliably detect when the vehicle is moving in a straight line, the processor may look for a linear vehicle acceleration or deceleration, e.g. braking event. In one example, the at least one predetermined condition may comprise a condition that vehicle acceleration determined from the OBD data has a magnitude greater than a predetermined threshold magnitude of acceleration in the predetermined time period. In one example, the at least one predetermined condition may comprise a condition that the vehicle acceleration magnitude determined from the OBD data varies by less than a predetermined amount or proportion in the predetermined time period. In one example, the at least one predetermined condition may comprise a condition that a direction of acceleration determined from the OBD data has an angular variation less than a predetermined threshold angle in the predetermined time period. In one example, the at least one predetermined condition may comprise a condition that a direction of velocity or acceleration determined from the OBD data is substantially constant in the predetermined time period.

The processor is preferably configured to determine when the magnitude of an OBD speed vector is increasing or decreasing for longer than a predetermined time period, e.g. a minimum threshold of three seconds. Further preferably the processor is configured to monitor the OBD speed vector in the xy-plane, determining when the vector has a constant direction indicating linear movement of the vehicle in the x-direction, e.g. aligned with the vehicle's forward direction of motion or braking direction. A variance in the direction of the OBD speed vector may be calculated, and compared by the processor to a limit, to ensure accuracy. During this time the processor may also monitor that the OBD speed vector has a magnitude that remains above a threshold value. The processor is then able to compare the direction of an acceleration vector measured by the accelerometer with the determined x-direction of the vehicle, and produce a calibration constant corresponding to the z-rotation between the two frames of reference. This calibration constant can be used by the processor to transform acceleration data measured by the accelerometer to the vehicle frame of reference before it is transmitted to an external mobile telecommunications device.

Accordingly the device is able to automatically calibrate, i.e. learn the relative orientation of the accelerometer, so as to be able to accurately identify acceleration/deceleration, cornering and/or braking events. The accelerometer is preferably arranged to detect a crash event. For example, a crash event may be indicated by detecting an acceleration/deceleration force greater than a predetermined threshold value, e.g. >1.5 g. As is discussed above, the device may comprise a memory for storing data and a crash event may be logged in the device's memory until it is paired with a mobile telecommunications device and the collected OBD data is transmitted. It will be appreciated that the accelerometer may be integrated with the processor. Where a memory is provided, this may be integrated with the processor and/or accelerometer.

There will now be described some further general features that may apply to any of the embodiments of the invention outlined above.

Optionally the OBD data collection device receives firmware updates when it is paired with an external mobile telecommunications device.

Optionally the OBD data collection device is configured to encode data before it is transmitted to an external mobile telecommunications device. Preferably the transmitted data is secured using end-to-end signing of the data. This prevents unauthorised interception and use or modification of the data. Preferably the transmitted data is secured using end-to-end encryption. An advantage of end-to-end encryption is that neither an attacker nor the user himself can decode the data. The device may provide a unique encryption key so that an external server can verify the origin of uploaded data.

Optionally the OBD data collection device detects vehicle identification information whenever it is connected to a vehicle OBD port. If there is a change in the vehicle identification information then the device may flag this up. The device therefore alerts a user when it has been moved to a different vehicle.

It will be understood that all of the features above relate to an OBD data collection device during use, i.e. when it is connected to a vehicle OBD port.

According to a second aspect of the present invention there is provided a method for collecting vehicle on-board diagnostics (OBD) data using a device having a connector for connecting the device to a vehicle OBD port, the method comprising: receiving OBD data and power from the vehicle OBD port; and controlling collection of the OBD data, wherein collection of the OBD data is controlled by monitoring a voltage at the connector to determine a vehicle engine state, the method comprising: (i) detecting an engine 'on' state from a temporary voltage drop of at least a predetermined magnitude; and (ii) detecting an engine 'off' state from a voltage value that is less than a threshold, taken in combination with OBD data relating to vehicle speed and/or engine revolutions.

Embodiments of such a method may comprise any of the features described hereinabove.

Methods in accordance with the present invention may be implemented at least partially using software, e.g. computer programs. The present invention thus also extends to a computer program comprising computer readable instructions executable to perform a method according to any of the embodiments of the invention.

The invention thus also extends to a computer software carrier comprising software which when used to operate a system or apparatus comprising data processing means causes, in conjunction with said data processing means, said apparatus or system to carry out the steps of a method in accordance with embodiments of the present invention. Such a computer software carrier could be a non-transitory physical storage medium, such as a ROM chip, CD ROM or disk, or could be a signal, such as an electronic signal over wires, an optical signal or a radio signal such as to a satellite or the like.

The present invention in accordance with any of its further aspects or embodiments may include any of the features described in reference to other aspects or embodiments of the invention to the extent it is not mutually inconsistent therewith.

Advantages of these embodiments are set out hereafter, and further details and features of each of these embodiments are defined in the accompanying dependent claims and elsewhere in the following detailed description.

BRIEF DESCRIPTION OF THE DRAWINGS

Some preferred embodiments of the present invention will now be described, by way of example only, and with reference to the accompanying drawings, in which.

DETAILED DESCRIPTION OF THE PREFERRED EMBODIMENTS

Figure 1:
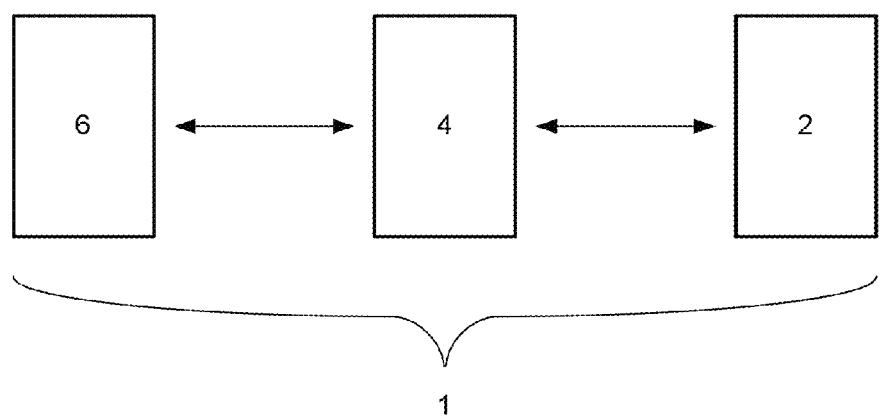
FIG. 1 is a schematic overview of a collection system for vehicle on-board diagnostics (OBD) data.

From FIG. 1 it will be understood that a collection system 1 for vehicle on-board diagnostics (OBD) data generally comprises a wireless communication device or dongle 2, a mobile telecommunications device such as a smartphone 4, and an external server 6. While the dongle 2 collects OBD data from a vehicle OBD port, it is a user's smartphone 4 that provides user interaction and data transmission. The dongle 2 may pair with the smartphone 4 using Bluetooth or other short-range wireless communication protocol. Long-term storage of OBD data is provided by the external server 6 so as to ensure data security and integrity.

Figure 2:
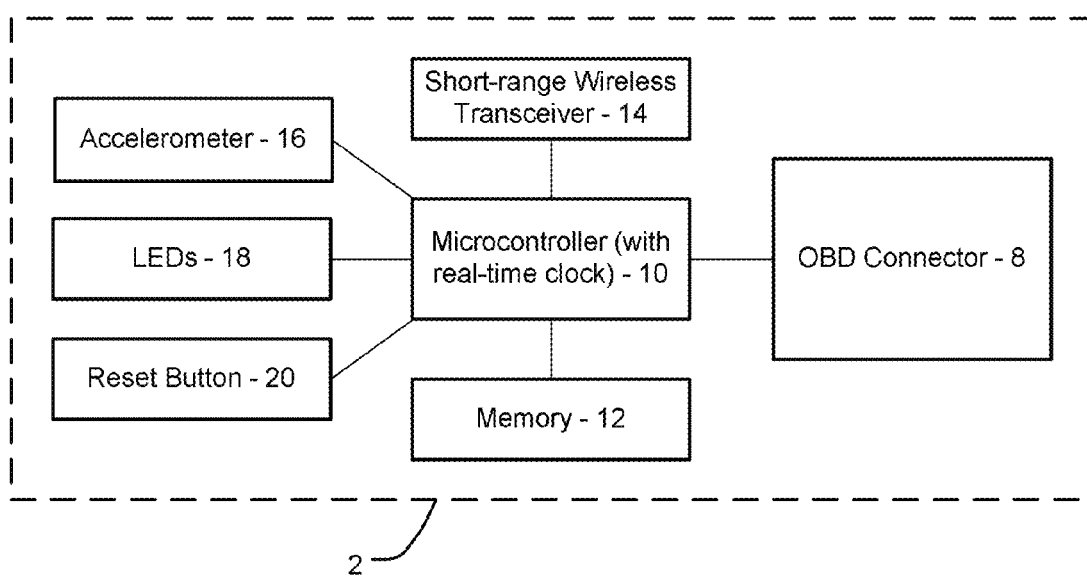
FIG. 2 is a block diagram of an exemplary OBD data collection device for use in such a system.

An exemplary wireless communication device or dongle 2 is seen from FIG. 2 to include a physical connector 8 that can mate with a vehicle OBD port to receive OBD data and power. The internal components of the dongle 2 comprise a processor 10 (such as a microcontroller), an optional memory 12 (such as a flash memory), a short-range wireless (e.g. Bluetooth) transceiver 14, and optionally an accelerometer 16, one of more LEDs or other indicators 18, and a reset button 20. The processor 10 may include a real-time clock arranged to apply time stamps to the collected OBD data before it is stored in the memory 12. The collected OBD data may be saved in the memory 12 until such time that a user initiates data transmission to the smartphone 4 or the smartphone may automatically initiate data upload without user interaction, e.g. if automatic data upload is enabled. The dongle 2 may collect and store OBD data in its memory 12 for extended periods of time between upload processes, e.g. up to at least 30 days. However, the local memory 12 may be omitted if the collected OBD data is transmitted in real time from the dongle 2 to the smartphone 4, and thereafter to the external server 6 for long-term storage.

Figure 3A:
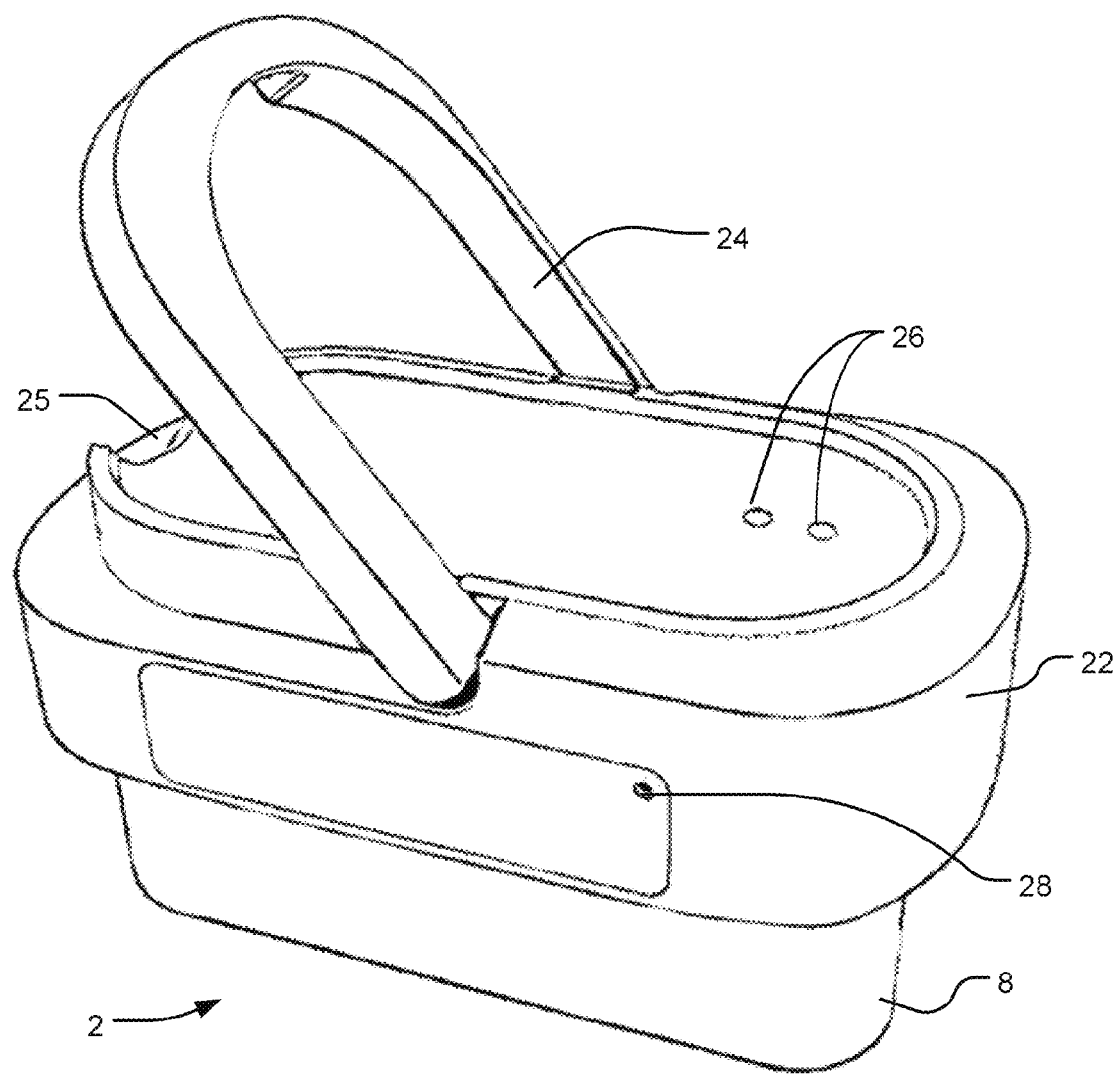
FIGS. 3A to 3C illustrate various possible physical embodiments of such an OBD data collection device.
Figure 3B:
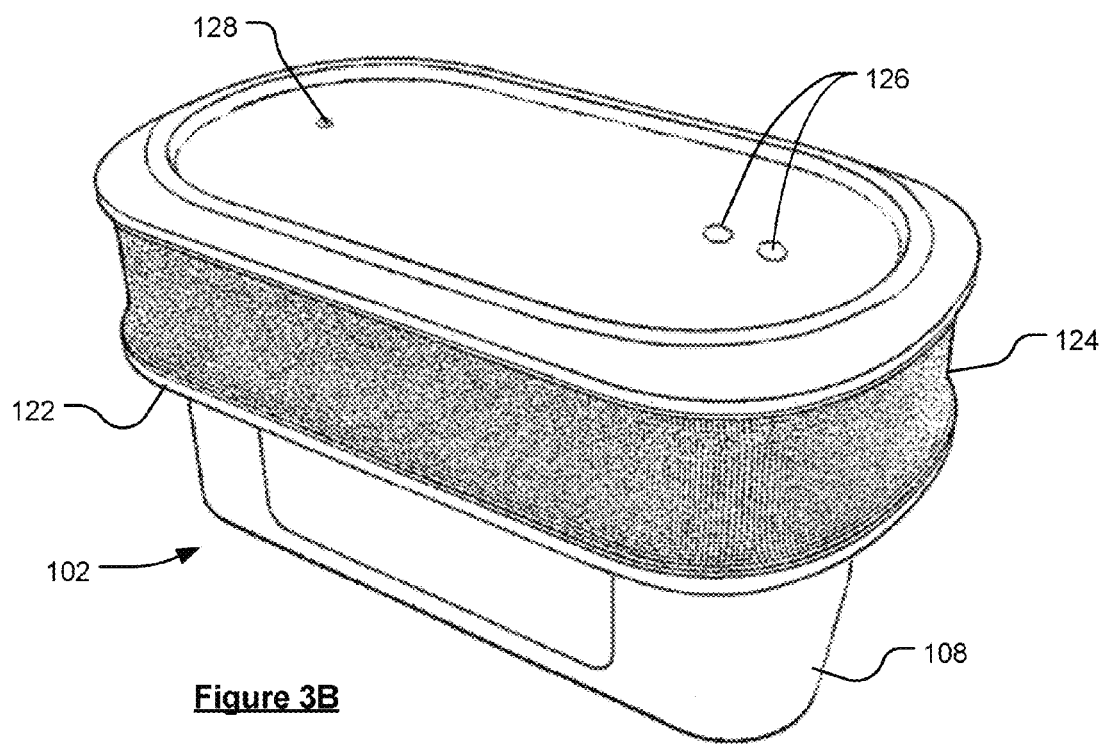
Figure 3C:
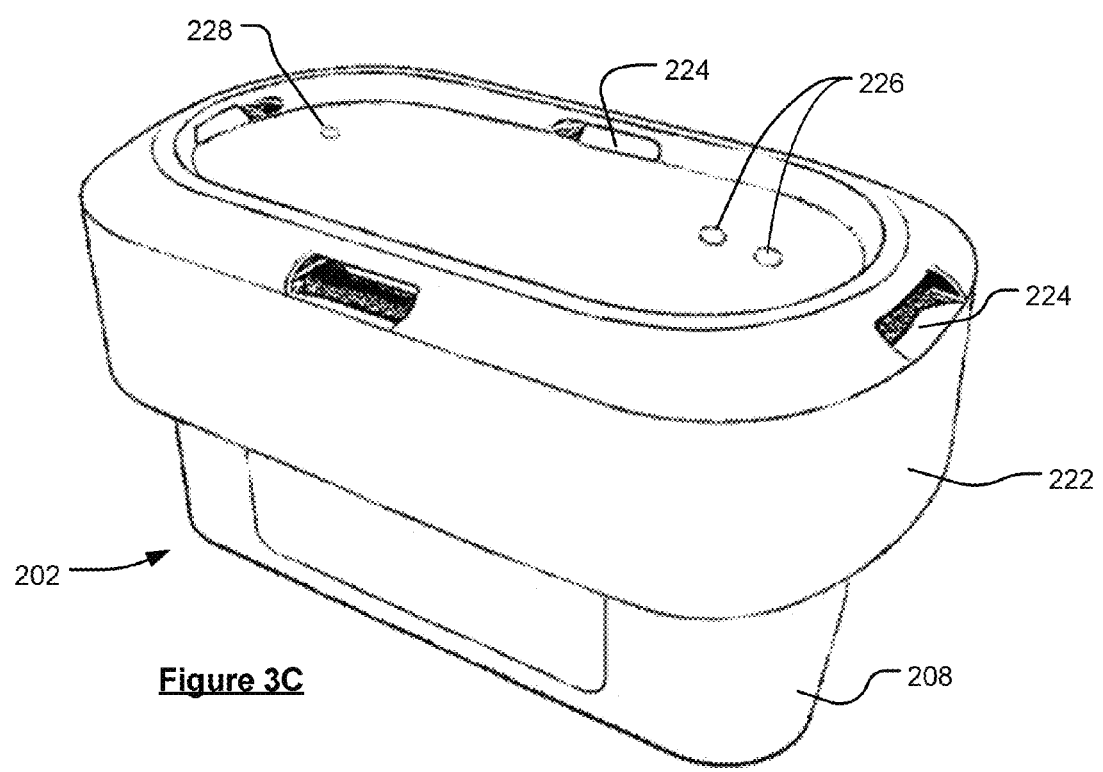

Some possible physical embodiments of such a dongle 2 are shown in FIGS. 3A to 3C. In FIG. 3A the dongle 2 has the connector 8 integrated with a housing 22 for the internal components. A handle 24 is hingedly connected to the housing 22 so that a user can easily remove the dongle 2 by lifting the handle 24 to pull the connector 8 out of a vehicle OBD port. The handle 24 is flush with an upper surface of the housing 22 when it is not in use and a fingernail indentation 25 in the housing 22 enables a user to lift the handle 24 up. Two LEDs 26, visible on the upper surface of the housing 22, can inform a user about the status of the dongle 2. A reset switch 28 is provided on a side of the housing 22. In FIG. 3B the dongle 102 is similar, comprising a connector 108, housing 122 and indicator LEDs 128. However in this embodiment the dongle 102 is designed to be removed from a vehicle OBD port by a user grabbing the housing 122, which has a recessed groove 124 around its perimeter to aid with gripping. A reset switch 128 is provided on the upper surface of the housing 122 so that it is not accidentally pressed when a user grabs the dongle 102. In FIG. 3C the dongle 202 comprises a connector 208 and housing 222, with indicator LEDs 228 and a reset switch 228 provided on an upper surface of the housing 222. In this embodiment the housing 222 is provided with a number of apertures 224 that enable a cable or lanyard to be threaded through, so that a user can pull the cable of lanyard to release the dongle 202 from a vehicle OBD port. In all of these embodiments the height of the dongle 2 is only 20-25 mm, in particular 24-25 mm, so that dongle 2 does not unduly protrude from the recess of a vehicle OBD port.

Figure 4:
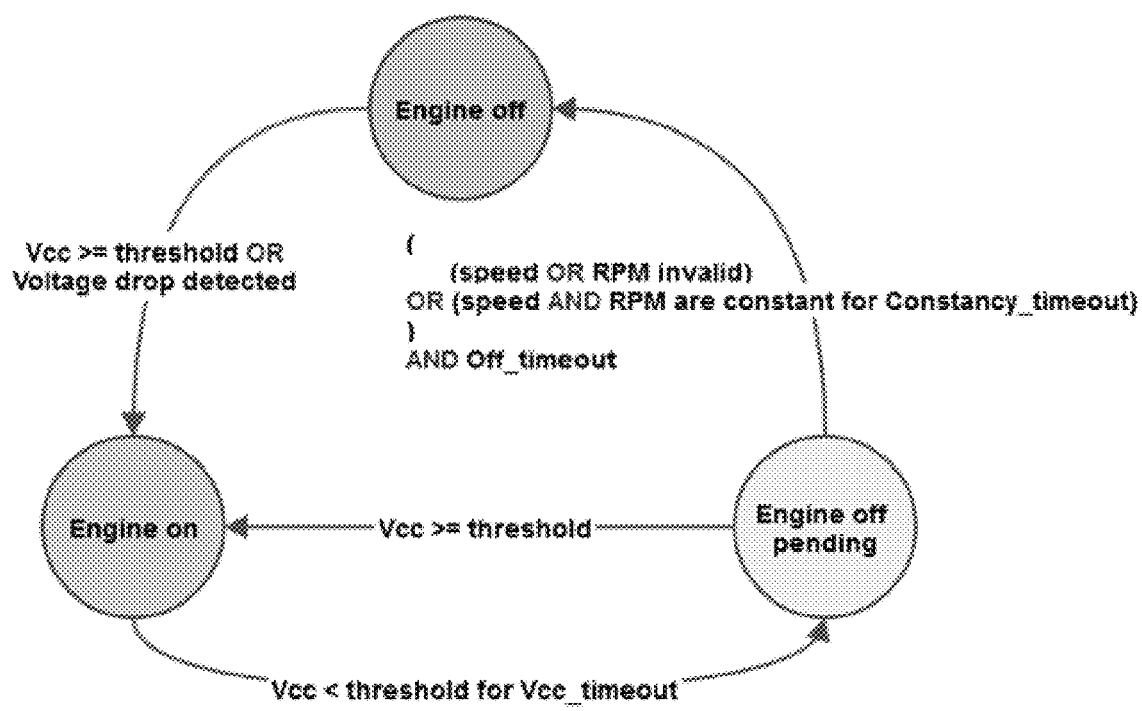
FIG. 4 illustrates a process for engine state detection that may be carried out by an OBD data collection device.

FIG. 4 illustrates an exemplary method for determining a vehicle engine state by monitoring a voltage at the OBD connector 8 in combination with OBD data relating to vehicle speed and/or engine revolutions (rpm). In smart-charging vehicles, the point in time that the alternator starts charging the battery, signalled by a rise in the voltage level to above a threshold of 13.2 volts (V), is unpredictable to a third party, which renders it inappropriate to determine the engine state solely based on voltage levels. Instead, this method detects an engine "on" state by detecting a temporary voltage drop of at least 2 V. Although it will be seen from FIG. 4 that the OBD connector 8 continues to detect when the voltage level rises to a level greater than or equal to a threshold of 13.2 V, as this remains an indicator of the engine being in an "on" state for older vehicles that do not use smart-charging technologies.

Figure 5:
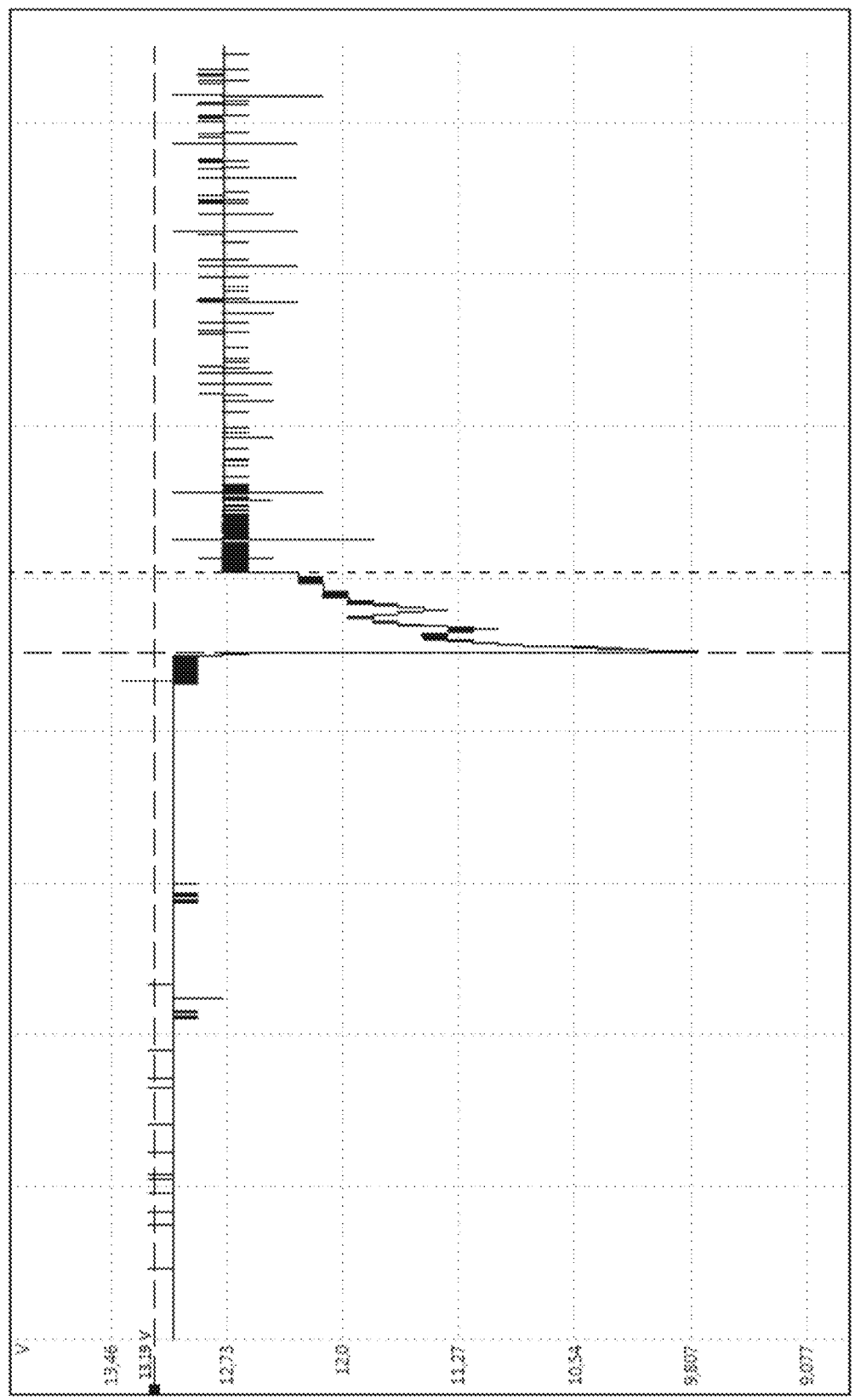
FIG. 5 provides an example of a voltage spike detected at the OBD connector when the engine is started.

FIG. 5 illustrates the significant voltage drop that occurs each time the engine is started, resulting in spikes that are between 400 ms and 1000 ms long. These voltage spikes are highly distinguishable from the far smaller voltage drops that may be caused by any other electrical component being connected to the battery. A voltage sampling frequency of 8 Hz may be chosen so as to reliably detect such voltage spikes. An integral of three samples is compared to a mid-term average and, if large enough, the processor 10 in the dongle 2 notes an "engine on" event. Even if an attempt to start the engine fails, which is impossible to detect, the vehicle's ECU will be awake and can provide an update to the OBD dongle 2.

Figure 6:
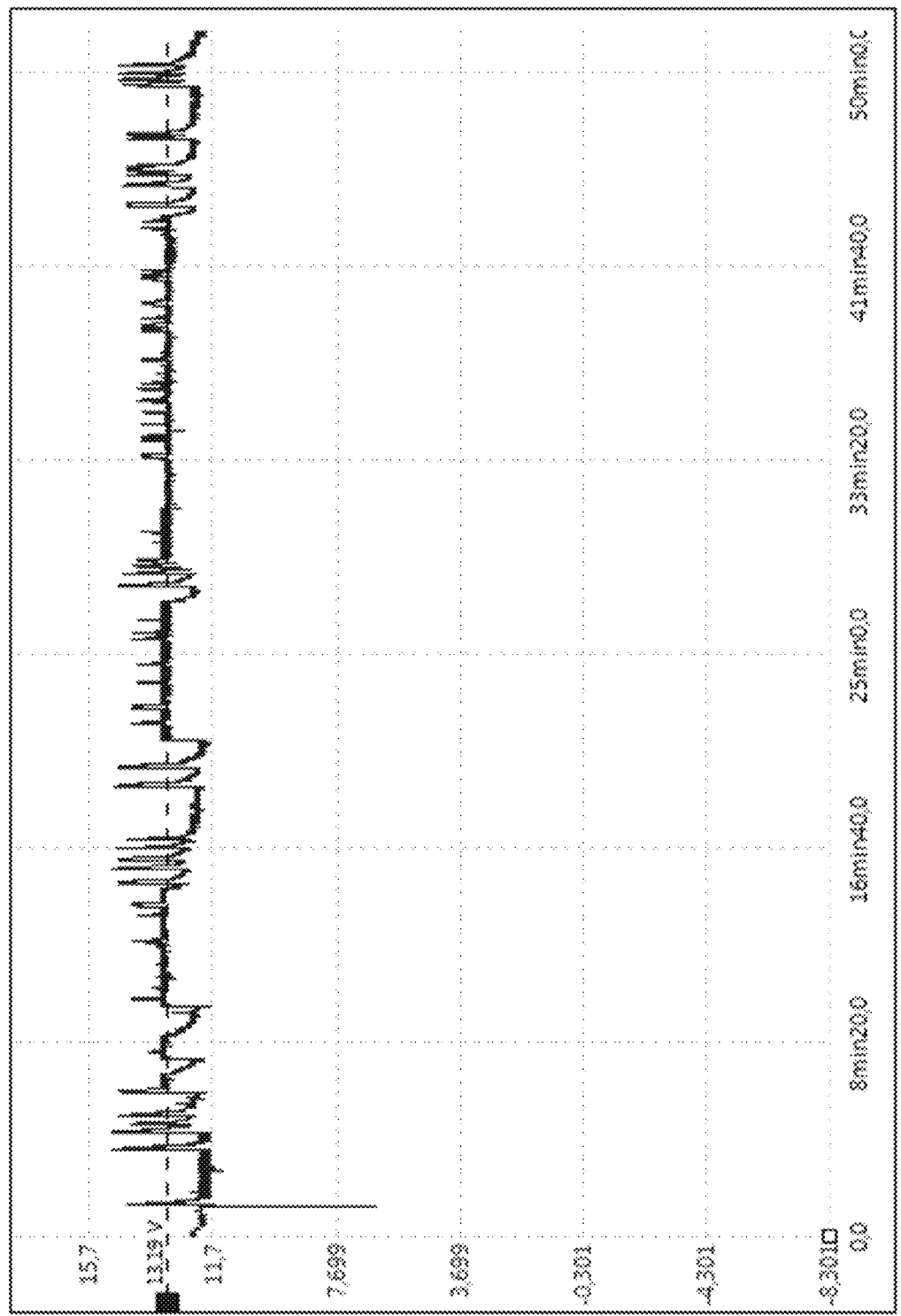
FIG. 6 provides an example of the typical changes in voltage level as a function of time for a smart-charging vehicle.

FIG. 6 illustrates how the voltage level can drop below the normal threshold of 13.2 V at any time, due to smart-charging, even though the vehicle is still driving with the engine running. In order to take this into account, OBD data relating to vehicle speed and rpm are taken into account so as to reliably detect an engine "off" state. It may be seen from FIG. 4 that the voltage $V_{cc}$ at the OBD connector 8 is periodically compared to a threshold, e.g. of 13.2 V. If $V_{cc}$ is found to have dropped below the threshold for a time period $V_{cc\_}$timeout of 3 seconds, then the processor 10 detects a pending engine "off" state. In order to confirm the pending engine "off" state, the vehicle speed and rpm are assessed before issuing a final engine "off" state. To detect when the engine has actually stopped, either the OBD data relating to vehicle speed and rpm must be invalid, because the vehicle ECU has stopped transmitting, or the OBD data values must be constant (also including zero) for a time period of Constancy_timeout. For example, a period of 2 to 5 seconds may be chosen for Constancy_timeout. This is because there are vehicles that report constant non-zero values for speed and rpm even after the engine has been stopped. Finally, the processor 10 waits for a final time period Off_timeout, e.g. of 10 seconds before detecting a transition from the pending engine "off" state to a final engine "off" state. The time periods of Constancy_timeout and Off_timeout may add up to a total wait time of 10 to 20 seconds before a final engine "off" state is issued.

Upon determining a final engine "off" state the processor 10 instructs an end to the collection of OBD data from the vehicle OBD port. The dongle 2 may then enter a sleep mode until a further change in engine state is determined. The dongle 2 may support different levels of operation, namely running and sleeping, to reduce power consumption when the vehicle's engine is not running, and to avoid disturbing the car's ECU when the car is not in use. In the sleeping mode, the dongle processor 10 is halted until it wakes up because of an interrupting execution, for example from a voltage drop being detected. Once the dongle 2 is running again, the collection of OBD data is resumed.

It will be appreciated that whilst various aspects and embodiments of the present invention have heretofore been described, the scope of the present invention is not limited to the particular arrangements set out herein and instead extends to encompass all arrangements, and modifications and alterations thereto, which fall within the scope of the appended claims.

For example, whilst embodiments described in the foregoing detailed description refer to the use of a smartphone (or other similar mobile telecommunications device) to transfer data to and from the OBD dongle and server, it will be appreciated that any suitable form of gateway (or Internet-enabled device) may be used to provide the necessary connection. For example, the OBD dongle may communicate wirelessly with a computing device, such as a portable computer, laptop, or other similar mobile device, which in turn communicates with the server using any suitable means, e.g. via the telecommunications network.

It will also be well understood by persons of ordinary skill in the art that whilst the preferred embodiment may implement certain functionality by means of software, that functionality could equally be implemented solely in hardware (for example by means of one or more SICs (application specific integrated circuit)) or indeed by a mix of hardware and software.

Lastly, it should be noted that whilst the accompanying claims set out particular combinations of features described herein, the scope of the present invention is not limited to the particular combinations hereafter claimed, but instead extends to encompass any combination of features or embodiments herein disclosed irrespective of whether or not that particular combination has been specially enumerated in the accompanying claims at this time.

The invention claimed is:

1. A device for detecting a state of a vehicle's engine using vehicle on-board diagnostics (OBD) data, the device comprising:
   a connector for connecting the device to a vehicle OBD port to receive OBD data and power; and
   a processor arranged to determine a vehicle engine state by monitoring a voltage at the connector, the processor:
   (i) detecting an engine 'on' state from a temporary voltage drop of at least a predetermined magnitude; and
   (ii) detecting an engine 'off' state by:
      detecting a pending engine 'off' state from a voltage value that is less than a threshold;
      confirming the pending engine 'off' state from the OBD data indicating at least one of vehicle speed and engine revolutions are at a constant non-zero value for a first predetermined time period; and
      detecting a final engine 'off' state after a second predetermined time period; and
      based on detecting the engine 'off' state, changing a level of operation of the device from a running mode to a sleep mode, wherein, in the sleep mode, no power is drawn by the device from the ODB port.

2. The device according to claim 1, wherein the processor is arranged to detect the pending engine 'off' state from a voltage value that is less than the threshold for a third predetermined time period.

3. The device according to claim 2, wherein the third predetermined time period is at least 1 second.

4. The device according to claim 1, wherein the threshold is at least 13 volts.

5. The device according to claim 1, wherein the first predetermined time period is at least 5 seconds.

6. The device according to claim 1, wherein the second predetermined time period is at least 10 seconds.

7. The device according to claim 1, where the processor is arranged to detect the engine 'on' state from a temporary voltage drop of at least 2 volts.

8. The device according to claim 1, where the processor is arranged to detect the engine 'on' state from a temporary voltage drop of at least a predetermined magnitude that lasts for a time period of less than 1 second.

9. The device according to claim 1, wherein the processor is arranged to detect the engine 'on' state by sampling the voltage at the connector at a frequency of at least 8 Hz.

10. The device according to claim 1, wherein the processor is arranged to control collection of the OBD data by at least one of: starting the collection of the OBD data when the engine 'on' state is detected; and by stopping the collection of the OBD data when the final engine 'off' state is detected.

11. The device according to claim 1, wherein the processor is arranged to use the determined vehicle engine state to set a start and an end of a trip, so as to determine a trip duration.

12. The device according to claim 1, wherein the processor is arranged to, based on detecting the engine 'on' state, change a level of operation of the device from a sleep mode to a running mode.

13. A non-transitory computer readable medium comprising computer readable instructions that, when executed by at least one processor of a device having a connector for connecting the device to a vehicle OBD port, causes the device to perform a method comprising:
  receiving OBD data and power from the vehicle OBD port;
  determining a vehicle engine state by monitoring a voltage at the connector, said determining comprising:
    (i) detecting an engine 'on' state from a temporary voltage drop of at least a predetermined magnitude; and
    (ii) detecting an engine 'off' state by:
      detecting a pending engine 'off' state from a voltage value that is less than a threshold;
      confirming the pending engine 'off' state from the OBD data indicating at least one of vehicle speed and engine revolutions are at a constant non-zero value for a first predetermined time period; and
      detecting a final engine 'off' state after a second predetermined time period; and
    based on detecting the engine 'off' state, changing a level of operation of the device from a running mode to a sleep mode, wherein, in the sleep mode, no power is drawn by the device from the ODB port.

14. The computer readable medium according to claim 13, wherein the pending engine 'off' state is detected from a voltage value that is less than the threshold for a third predetermined time period.

15. The computer readable medium according to claim 13, wherein the computer readable instructions, when executed, further cause the device to control collection of the OBD data by at least one of: starting the collection of the OBD data when the engine 'on' state is detected; and by stopping the collection of the OBD data when the final engine 'off' state is detected.

16. The computer readable medium according to claim 13, wherein the computer readable instructions, when executed, further cause the device to use the determined vehicle engine state to set a start and an end of a trip, so as to determine a trip duration.

17. The computer readable medium according to claim 13, wherein the computer readable instructions, when executed, further cause the device to, based on detecting the engine 'on' state, change a level of operation of the device from a sleep mode to a running mode.

18. A method of detecting a state of a vehicle's engine from vehicle on-board diagnostics (OBD) data using a device having a connector for connecting the device to a vehicle OBD port, the method comprising:
  receiving OBD data and power from the vehicle OBD port;
  determining a vehicle engine state by monitoring a voltage at the connector, said determining comprising:
    (i) detecting an engine 'on' state from a temporary voltage drop of at least a predetermined magnitude; and
    (ii) detecting an engine 'off' state by:
      detecting a pending engine 'off' state from a voltage value that is less than a threshold;
      confirming the pending engine 'off' state from the OBD data indicating at least one of vehicle speed and engine revolutions are at a constant non-zero value for a first predetermined time period; and
      detecting a final engine 'off' state after a second predetermined time period; and
    based on detecting the engine 'off' state, changing a level of operation of the device from a running mode to a sleep mode, wherein, in the sleep mode, no power is drawn by the device from the ODB port.

* * * * *